(12) United States Patent
Shimizu et al.

(10) Patent No.: US 6,239,471 B1
(45) Date of Patent: *May 29, 2001

(54) MIS TRANSISTOR AND MANUFACTURING METHOD THEREOF

(75) Inventors: Satoshi Shimizu; Hidekazu Oda, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/869,172

(22) Filed: Jun. 4, 1997

(30) Foreign Application Priority Data

Dec. 10, 1996 (JP) .................................................... 8-329473

(51) Int. Cl.[7] .......................... H01L 29/76; H01L 29/94; H01L 31/062; H01L 27/088
(52) U.S. Cl. ........................... 257/408; 257/900; 257/384
(58) Field of Search ........................ 257/900, 382–384, 257/392, 408–414; 348/300–305

(56) References Cited

U.S. PATENT DOCUMENTS

| 4,906,589 | * | 3/1990 | Chao | 438/586 |
|---|---|---|---|---|
| 4,908,326 | * | 3/1990 | Ma et al. | 257/900 |
| 5,021,353 | | 6/1991 | Lowrey et al. . | |
| 5,102,816 | | 4/1992 | Manukonda et al. . | |
| 5,153,145 | * | 10/1992 | Lee et al. | 438/305 |
| 5,168,332 | * | 12/1992 | Kunishima et al. | 257/900 |
| 5,258,645 | * | 11/1993 | Sato | 257/408 |
| 5,324,974 | * | 6/1994 | Liao | 257/408 |
| 5,352,631 | * | 10/1994 | Sitaram et al. | 438/300 |
| 5,491,099 | | 2/1996 | Hsu . | |
| 5,518,960 | | 5/1996 | Tsuchimoto . | |
| 5,545,574 | * | 8/1996 | Chen et al. | 438/586 |
| 5,554,871 | | 9/1996 | Yamashita et al. . | |
| 5,714,413 | * | 2/1998 | Brigham et al. | 438/305 |
| 5,838,041 | * | 11/1998 | Sakagami et al. | 257/324 |
| 5,891,809 | * | 4/1999 | Chaw et al. | 438/770 |

FOREIGN PATENT DOCUMENTS

| 63-318779 | 12/1988 | (JP) . |
|---|---|---|
| 3-288443 | 12/1991 | (JP) . |
| 5-47785 | 2/1993 | (JP) . |
| 5-190566 | 7/1993 | (JP) . |
| 6-13402 | 1/1994 | (JP) . |
| 6-326122 | 11/1994 | (JP) . |
| 7-106280 | 4/1995 | (JP) . |
| 7-161991 | 6/1995 | (JP) . |
| 9-8292 | 1/1997 | (JP) . |

OTHER PUBLICATIONS

M. Sekine, et al., "Self–Aligned Tungsten Strapped Source/Drain and Gate Technology Realizing the Lowest Sheet Resistance for Sub–quarter Micron CMOS", IEDM, 1994, pp. 493–496.

* cited by examiner

Primary Examiner—Tom Thomas
Assistant Examiner—Cuong Quang Nguyen
(74) Attorney, Agent, or Firm—Oblon, Spivak, McClelland, Maier & Neustadt, P.C.

(57) ABSTRACT

This invention provides a MIS transistor with less electrical short between a gate and source/drain electrodes. A sidewall spacer 15 has a two-layer structure including a buffer layer 13 which consists of nitrided oxide silicon and a silicon nitrided layer 14 formed on the buffer layer 13. The sidewall spacer 15 serves as a mask to form a silicide film 10.

7 Claims, 7 Drawing Sheets

MIS TRANSISTOR AND MANUFACTURING METHOD THEREOF

BACKGROUND OF THE INVENTION

1. Field of the Invention

This invention relates to a MIS transistor and a manufacturing method thereof, and more specifically, to a salicide process using a refractory-metal silicide film.

2. Description of the Background Art

The following description is about a general and conventional self-aligned silicide process for forming a refractory-metal silicide film, with reference to FIGS. 10 to 13. A well 1a, an isolation oxide film 2 and an impurity layer 3 for controlling a threshold voltage are formed in a silicon substrate 1. Then, an oxide film, for example, with 6.5 nm thickness is formed on the silicon substrate 1, and 200 nm polycrystalline silicon to be a gate electrode is deposited on the oxide film. After given patterning by a photolithography process, the polycrystalline silicon is anisotropically etched to form a gate electrode 5. Next formed are lightly doped drain (LDD) regions 6, called "extension" as well, on which the oxide film is deposited by means of chemical vapor deposition (CVD). This oxide film is etched back by reactive ion etching to form sidewall spacer oxide films 7. Further, ion implantation of high concentration provides source/drain regions 8 of high density, and then thermal treatment is performed for activation. FIG. 10 is a sectional view showing the state after the activation.

Next, a salicide process is performed. First, the surface of the silicon substrate 1 is cleaned with an appropriate preliminary treatment to deposit a metal film 9 on a wafer surface (See FIG. 11). The metal film 9 is next heated under an appropriate atmosphere to form silicide films 10 with the polycrystalline silicon of the silicon substrate 1 and the gate electrode 5 (See FIG. 12). The composition of the silicide films 10 is expressed as MSix, where M represents a metal element consisting of the metal film 9 and x is a ratio of number of silicon atoms to the metal atoms. Actually, a rapid thermal annealing with a lamp annealing furnace is often performed in such a case. The rapid thermal annealing with the lamp annealing furnace performed soon after the deposition of the metal film 9 is hereinafter referred to as a first RTA. At this time, silicide reaction does not occur in the upper portions of the isolation oxide film 2 and the sidewall spacer oxide films 7 where no silicon exists, at least leaving the metal film 9 with no reaction on those portions (See FIG. 12). Then, the metal film 9 including the metal M with no reaction is selectively removed while the silicide films 10 consisting of the reacted silicide Msix remains (See FIG. 13). That is basically the end of the salicide process.

When the metal film 9 is made of, for example, cobalt, however, lateral growth is likely to occur in forming a cobalt silicide film <$CoSi_2$> in the first RTA at a thermal annealing temperature of more than 600° C. Thus, application of another RTA at a temperature of less than 600° C. is required after removing the metal film 9 in the first RTA. In this case, in the process of making $CoSi_2$ of Co and Si, $Co_2Si$ is first made, then CoSi, and finally $CoSi_2$.

Very possibly, penetration of the cobalt silicide film under the sidewall spacer oxide films 7 is caused by a diffusion species. In the process of making $Co_2Si$ of Co and Si, Co becomes the diffusion species, while Si the diffusion species in the process of making CoSi of $Co_2Si$. The application of the first RTA provides CoSi after making $Co_2Si$ of Co and Si. Further, the application of another RTA to the CoSi makes Co a diffusion species in the process of making $CoSi_2$. In the process of making $Co_2Si$ and $CoSi_2$, cobalt of a diffusion species is likely to be diffused in the silicon substrate 1, and lateral growth of the cobalt silicide film under the sidewall spacer oxide films 7 becomes remarkable. A rapid thermal annealing with a lamp annealing furnace is often performed in this case as well. Such thermal annealing with the lamp annealing furnace performed after removing the metal film 9 with no reaction is hereinafter referred to as a second RTA. Further, when the diffusion species in the formation of the silicide films is silicon such as $TiSi_2$, such penetration does not occur.

With the above-described process, an electrode can be selectively formed in a region exposing a silicon surface, which is the advantage of the salicide process. Further, when a gate length is shorter, increase in gate resistance in cobalt silicide is more moderate than that in titanium silicide. Thus, a high-density integrated circuit with a MIS transistor can be easily achieved through the use of cobalt silicide in the manufacturing process of the MIS transistor.

A MIS transistor produced by a conventional salicide process has recently improved in high density, and its gate length has become shorter and shorter, making a sidewall spacer smaller and smaller in width. With the application of the salicide process using cobalt as a metal M producing silicide reaction, penetration of the silicide films 10 formed on the source/drain regions occurs under the sidewall spacer oxide films 7 formed of the oxide film with the length L1 as shown in FIG. 13. This penetration of the silicide films causes deterioration in a gate breakdown voltage, decrease in reliability of a gate oxide film, and an electrical short between a gate and source/drain electrodes, which is especially serious in a gate electrode with small geometries.

SUMMARY OF THE INVENTION

The present invention is directed to a MIS transistor. According to a first aspect of the present invention, the MIS transistor comprises a silicon substrate; a gate insulation film formed on the silicon substrate; a gate electrode formed on the gate insulation film; a sidewall spacer including a silicon nitride layer, formed on both sides of the gate electrodes on the silicon substrate in contact with the silicon substrate; and a silicide film formed outside of the sidewall spacer in the silicon substrate, the silicide film including a metal to be diffusion species for silicon in silicide reaction.

Preferably, according to a second aspect of the present invention, in the MIS transistor of the first aspect, the sidewall spacer includes: a buffer layer formed on both sides of the gate electrodes on the silicon substrate in contact with the silicon substrate; and a silicon nitride layer formed on the buffer layer.

Preferably, according to a third aspect of the present invention, in the MIS transistor of the second aspect, the buffer layer in the sidewall spacer consists of nitrided oxide silicon.

The present invention is also directed to a manufacturing method of a MIS transistor. According to a fourth aspect of the present invention, the manufacturing method of a MIS transistor comprises steps of: forming a gate insulation film and a gate electrode, both of a MIS transistor, on a silicon substrate; forming a sidewall spacer including a silicon nitride layer, on both sides of the gate electrodes on the silicon substrate in contact with the silicon substrate; and a forming silicide film outside of the sidewall spacer in the silicon substrate by using a metal to be a diffusion species for silicon on a silicide reaction.

Preferably, according to a fifth aspect of the present invention, in the manufacturing method of a MIS transistor of the first aspect, the step of forming a sidewall spacer further includes steps of: forming a buffer layer on both sides of the gate electrodes on the silicon substrate in contact with the silicon substrate; and forming the silicon nitride layer on the buffer layer.

Preferably, according to a sixth aspect of the present invention, in the manufacturing method of a MIS transistor of the second aspect, the buffer layer in the sidewall spacer consists of nitrided oxide silicon.

In the MIS transistor of the first aspect of the present invention, suppression of lateral diffusion of the metal, a diffusion species in forming silicide, by the silicon nitride layer in the sidewall spacer prevents deterioration in gate resistance, decrease in reliability of a gate oxide film, and electrical short between a gate and source/drain electrodes.

In the MIS transistor of the second aspect of the present invention, suppression of the production of an interface state by the buffer layer in the sidewall spacer prevents deterioration in transistor characteristics.

In the MIS transistor of the third aspect of the present invention, the MIS transistor has improved in hot carrier resistance.

In the manufacturing method of the MIS transistor of the fourth aspect of the present invention, suppression of lateral diffusion of the metal, a diffusion species in forming silicide, by the silicon nitride layer in the sidewall spacer prevents deterioration in gate resistance, decrease in reliability of a gate oxide film, and electrical short between a gate and source/drain electrodes.

In the manufacturing method of the MIS transistor of the fifth aspect of the present invention, suppression of the production of an interface state by the buffer layer in the sidewall spacer prevents deterioration in transistor characteristics.

In the manufacturing method of the MIS transistor of the sixth aspect of the present invention, the MIS transistor has improved in hot carrier resistance.

The object of the present invention is to prevent deterioration in gate resistance, decrease in reliability of a gate oxide film, and electrical short between a gate and source/drain electrodes by controlling lateral growth of the cobalt silicide film under the sidewall spacer.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
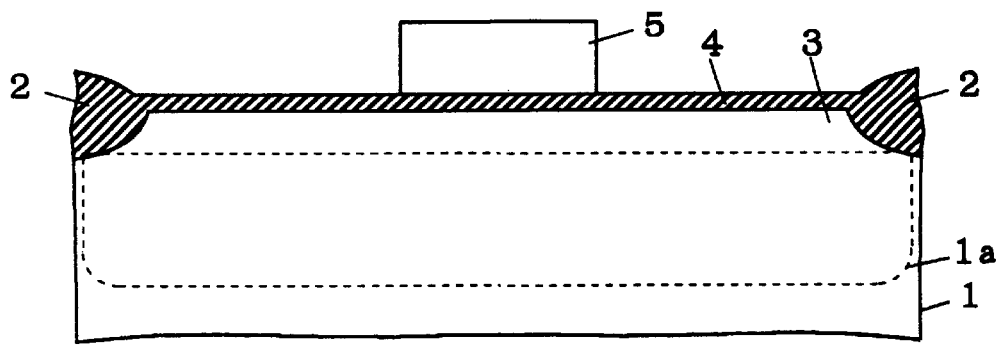
FIGS. 1 to 3 are sectional views showing a process of manufacturing a MIS transistor according to the present invention.

FIGS. 1 to 7 illustrate a manufacturing process of a MIS transistor according to the present invention, showing sectional views of a silicon substrate, in each step, in which the MIS transistor, especially a MIS field effect transistor (hereinafter referred to as MISFET), is to be formed. First, an isolation oxide film 2, a well 1a and an impurity layer 3 for controlling a threshold voltage are formed on a portion of a silicon substrate 1, in which the MISFET is to be formed, by a conventional and ordinary manufacturing method. Further, an oxide film with 6.5 mm thickness is formed in an area surrounded by the isolation oxide film 2 by the conventional method, and 200 nm polycrystalline silicon to be a gate electrode is deposited on the oxide film. After the formation of a resist film and patterning, a gate electrode 5 is formed by anisotropic etching of the polycrystalline silicon (See FIG. 1).

Figure 2:
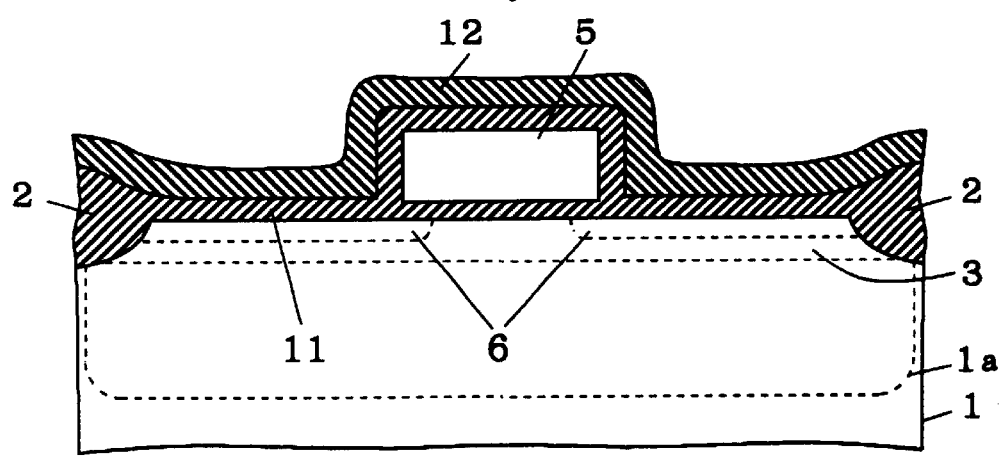

Next, nitrogen implantation into all regions exposing silicon is followed by the formation of LDD regions 6. With a CVD method, an oxide film 11 is deposited in contact with the surface of the silicon substrate 1, and a nitride film 12 is then deposited. At this time, the oxide film 11 to be a lower layer of a sidewall spacer is about 150 Å in thickness, and the nitride film 12 to be an upper layer of the sidewall spacer about 800 Å. FIG. 2 shows a section of the silicon substrate in this state.

Figure 3:
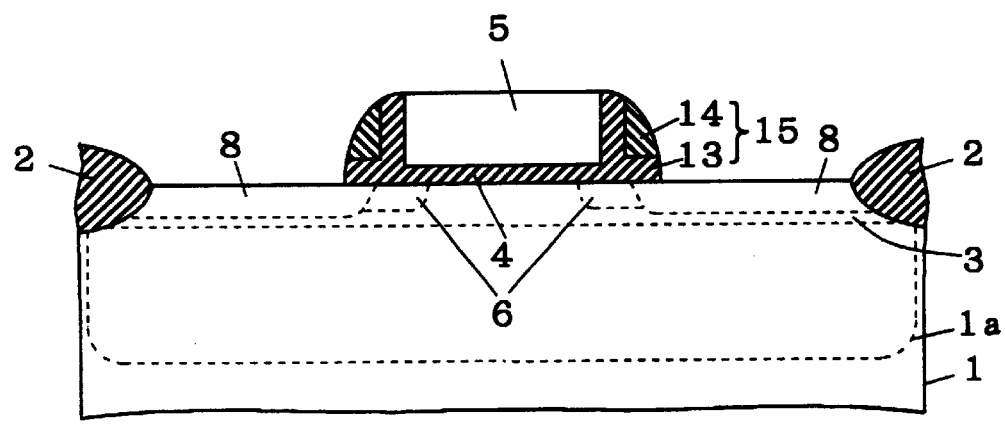
Figure 4:
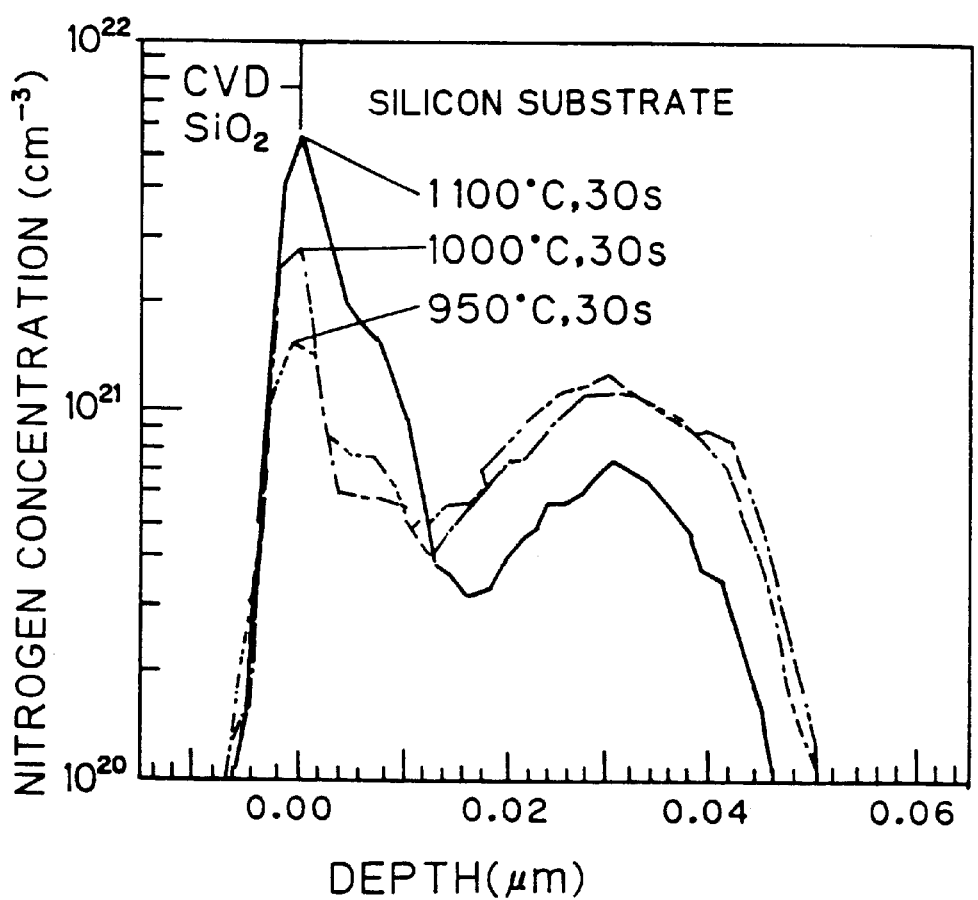
FIG. 4 is a graph illustrating nitrogen concentration in accordance with the depth of a silicon substrate.
Figure 5:
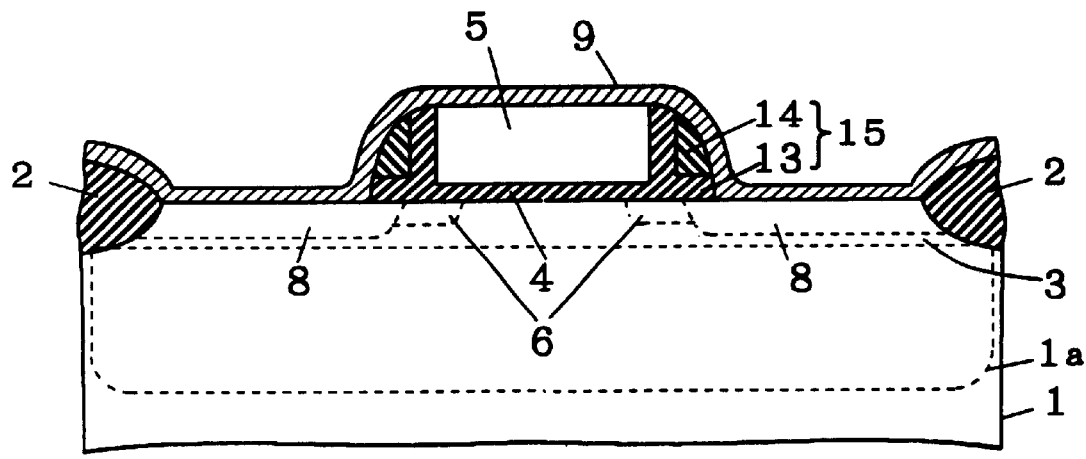
FIGS. 5 to 7 are sectional views showing a process of manufacturing a MIS transistor according to the present invention.

Next, the nitride film 12 and the oxide film 11 are etched back by means of reactive ion etching to form a sidewall spacer 15. The sidewall spacer 15 has a two-layer structure consisting of a buffer layer 13 formed in contact with the silicon substrate 1 and silicon nitride layers 14 formed on the buffer layer 13. Though the buffer layer 13 is also in contact with the gate electrode 5, this is just what the structure is and not a requisite for the present invention. FIG. 3 shows the state that an RTA is performed at about 1000° C. for 30 seconds after the introduction of impurity into a region to be source/drain regions to form source/drain regions 8. At this time, nitrogen in the polycrystalline silicon of the gate electrode 5 and in the source/drain regions 8 penetrates into a gate insulation film 4 and the buffer layer 13 in the sidewall spacer 15, causing nitriding of the gate insulation film 4 and the buffer layer 13 in the sidewall spacer 15. FIG. 4 shows nitrogen concentration in accordance with the depth of the silicon substrate 1. The boundary between the silicon substrate 1 and the sidewall spacer 15 is equivalent to 0.00 μm in the graph shown in FIG. 4.

Figure 6:
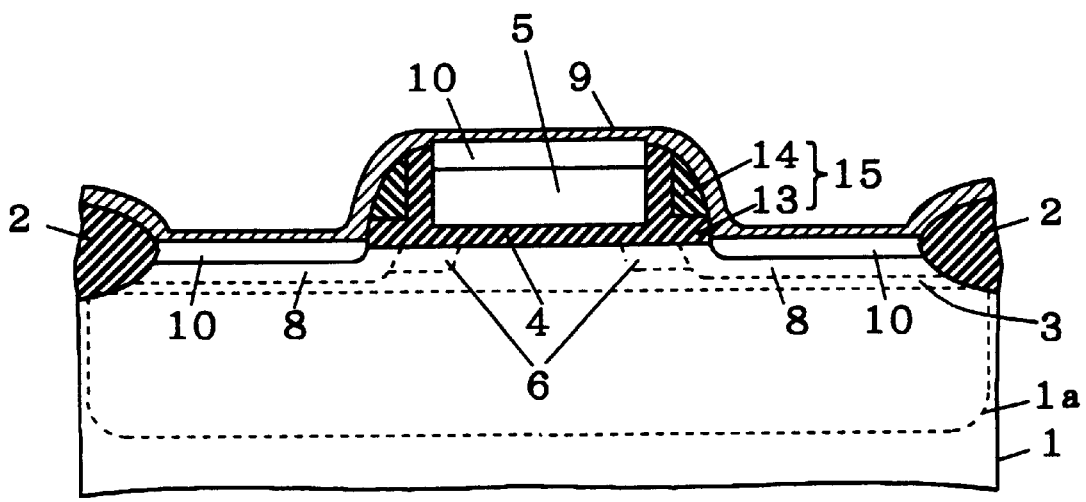
Figure 7:
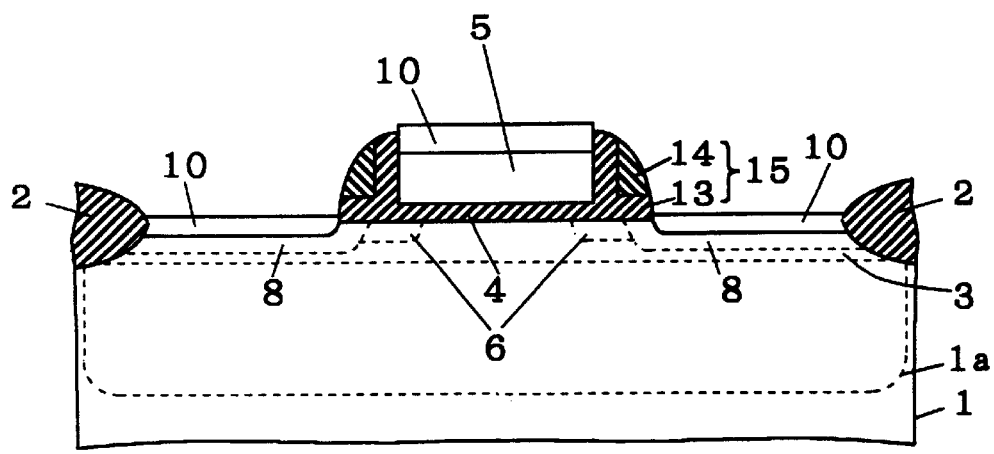

Next, a salicide process provides a silicide film on the gate electrode 5 and the source/drain regions 8. First, cobalt <Co> is deposited by means of sputtering (See FIG. 5). The cobalt mixing smoothens the roughness of an interface between the silicon substrate 1 and a silicide film 10. In this case, the silicide film 10 made of cobalt is formed on account of the progress of silicide reaction by a two-step RTA, as shown in FIG. 6. FIG. 7 shows a section of the silicon substrate 1 when the metal film 9 with no reaction is removed.

Figure 8:
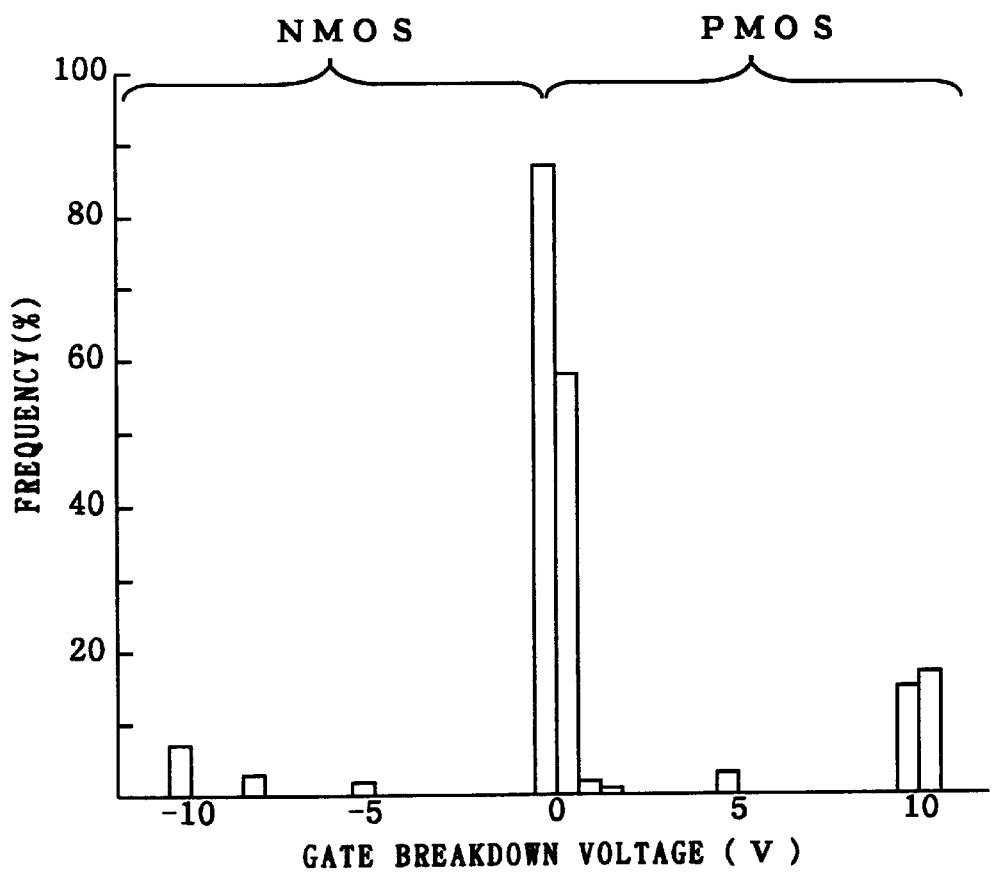
FIG. 8 is a graph illustrating correlation between a gate breakdown voltage and its frequency according to a conventional MIS transistor.
Figure 9:
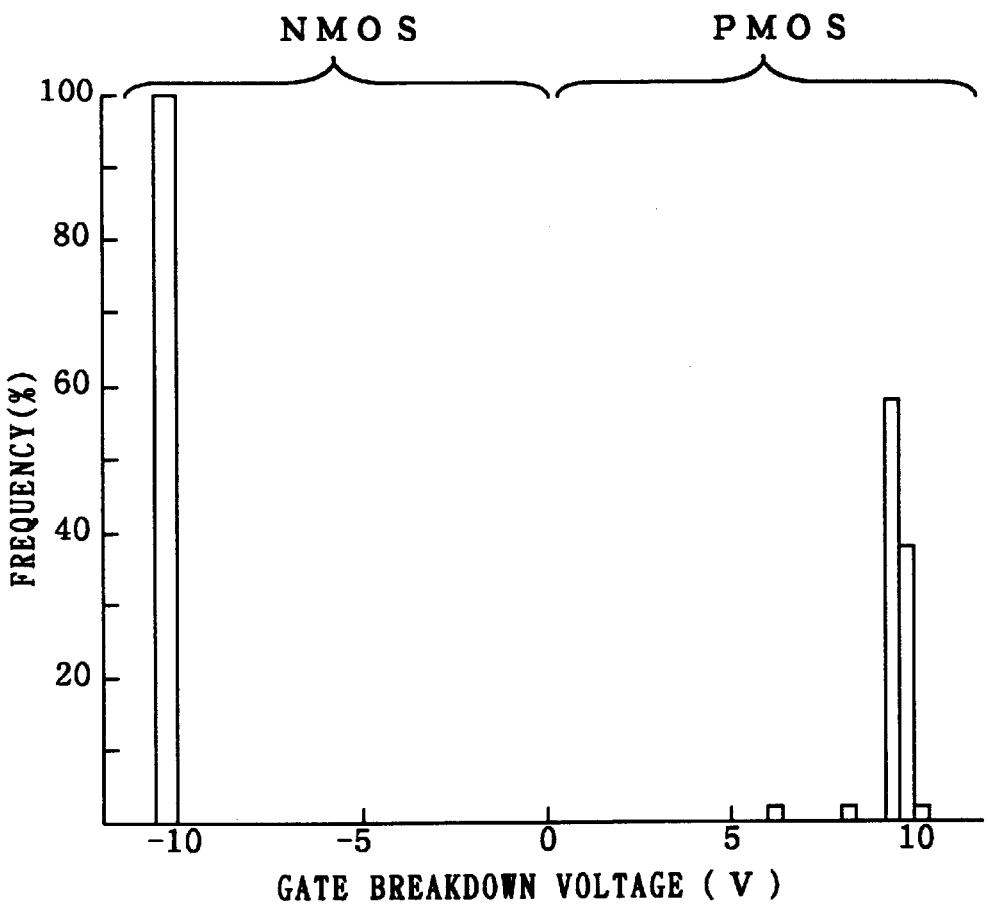
FIG. 9 is a graph illustrating correlation between a gate breakdown voltage and its frequency of the MIS transistor according to the present invention.
Figure 10:
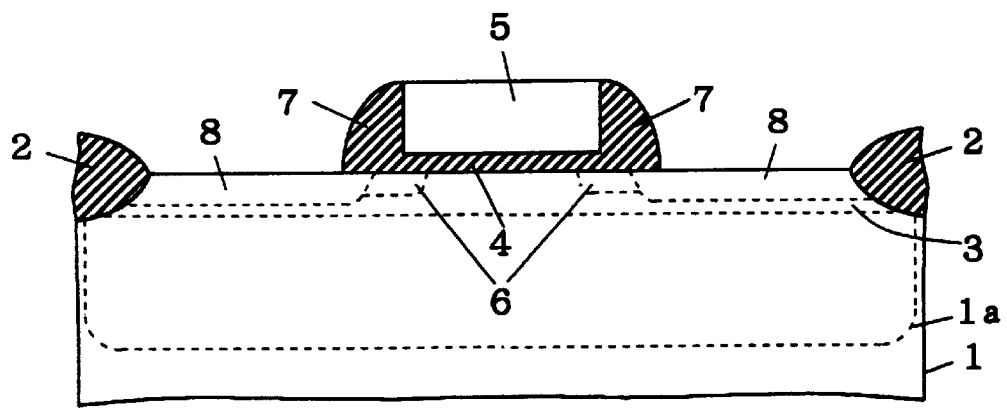
FIGS. 10 to 13 are sectional views showing a process of manufacturing the conventional MIS transistor.
Figure 11:
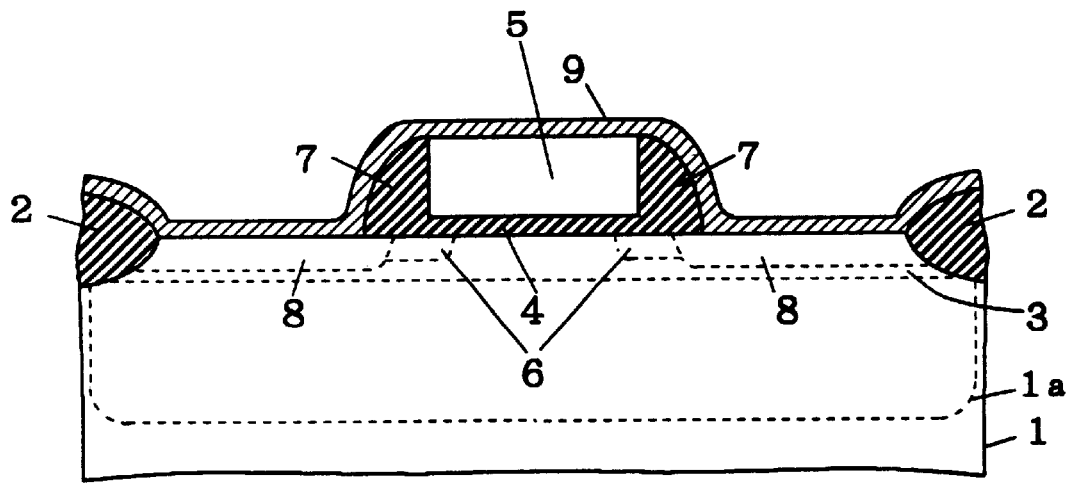
Figure 12:
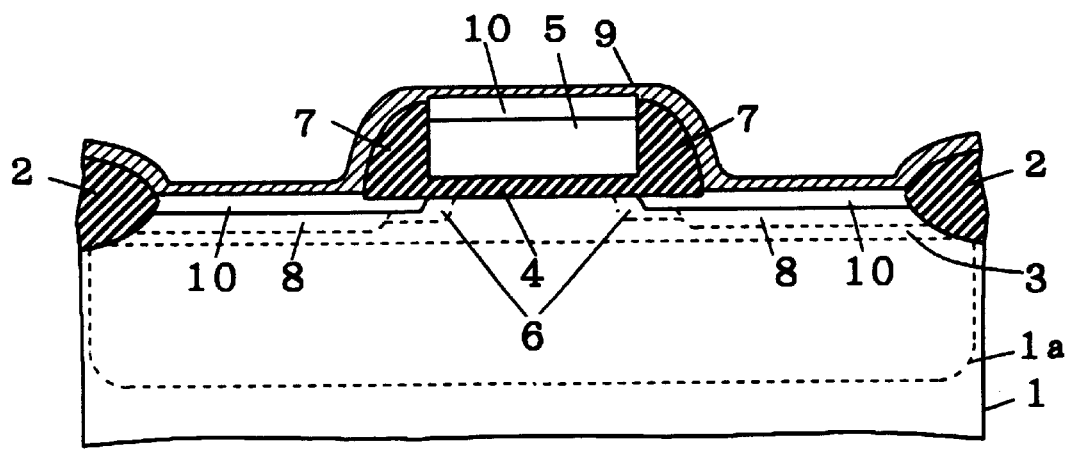
Figure 13:
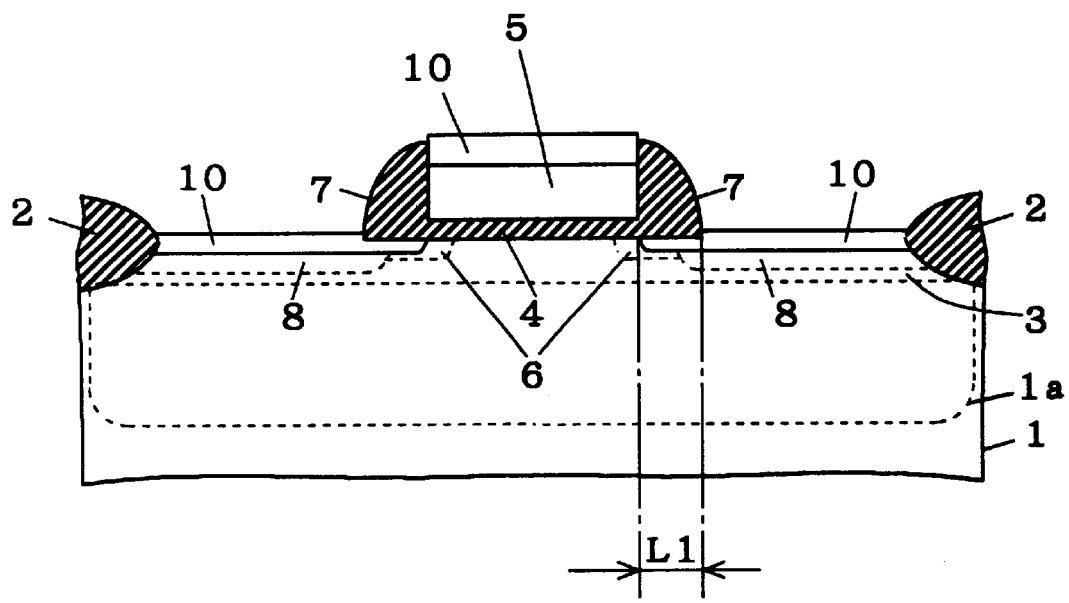

The sidewall spacer 15 formed in the above process includes the buffer layer 13 which consists of nitrided oxide silicon in the last result. Thus, in the MISFET, the two-layer structure of the sidewall spacer 15 prevents penetration of the silicide film 10 made of cobalt under the sidewall spacer 15. The buffer layer 13 made of nitrided oxide silicon and the silicon nitride layers 14, which consist of the sidewall spacer 15, suppress lateral diffusion of $CoSi_2$ under the sidewall spacer 15 with mechanical stress of the silicon nitrided layers 14. The suppression of lateral diffusion of $CoSi_2$ under the sidewall spacer 15 prevents deterioration in gate resistance, decrease in reliability of a gate oxide film, and an electrical short between a gate and source/drain electrodes in a $CoSi_2$-salicided transistor. FIGS. 8 and 9 are graphs showing correlation between a gate breakdown voltage and its frequency in the MIS transistor according to a conventional technique and the present invention, respectively. For easy evaluation of electrical short in frequency between a gate and source/drain electrodes, a transistor with a gate edge length of 216 mm is here measured. In these graphs, breakdown due to a positive gate breakdown voltage is caused by a P-channel transistor while breakdown due to a negative gate breakdown voltage by an n-channel transistor. In FIG. 9, more elements get breakdown at a higher absolute value of the gate breakdown voltage than that shown in FIG. 8. This indicates that stability of gate resistance has been improved since a range of the silicide films 10 penetrating under the gate insulation film 4 becomes smaller than that of the conventional silicide films 10.

Though cobalt is used as a metal for silicide reaction in this preferred embodiment, the same applies to a metal to be a diffusion species in forming silicide or to an alloy including the metal, both suffering penetration as well, with the use of the aforementioned two-layer sidewall spacer. In salicidation of the MIS transistor including the two-layer sidewall spacer 15, the buffer layer 13 made of nitride oxide silicon keeps the interface state between the sidewall spacer 15 and the silicon substrate 1 in the same state as that of a conventional sidewall spacer consisting only of nitrided oxide silicon. The use of nitrided oxide silicon for the buffer layer 13 in the sidewall spacer 15 has an advantage in obtaining improvement in hot electron resistance compared to the use of silicon oxide.

Further, direct disposition of a silicon nitride layer on the silicon substrate 1 would prevent lateral growth of silicide under the sidewall spacer 15 as well. The same applies to deposition of silicon nitride layer on a thin film gate oxide film 4 with a thickness of about 20 to 100 Å. In these cases, however, a large amount of the interface state is produced on interfaces between the silicon substrate 1 and the silicon nitrided layer or the thin film gate oxide film by stress in the deposition of the silicon nitride layer, resulting in deterioration in transistor characteristics. In the two-layer sidewall spacer 15 including the buffer layer 13 which consists of nitrided oxide silicon and the silicon nitride layers 14, the buffer layer 13 of the under layer (CVD oxide film) suppresses the production of the interface state. Thus, the buffer layer 13 which consists of oxide film, for example, would have the same effect as described above. The omission of nitrogen implantation from the above-mentioned manufacturing process provides the buffer layer 13 which consists of the oxide film in the sidewall spacer 15. With a multi-layer structure of more than two layers including a buffer layer, the sidewall spacer 15 can obtain the same effect of suppressing the production of the interface state on the silicon substrate 1 as described in the above preferred embodiment.

Furthermore, though applied in producing $CoSi_2$ in the above-described preferred embodiment, the two-step RTA is conventionally applied to suppressing lateral diffusion. Thus, $CoSi_2$ made of Co and Si can be obtained by a single RTA as well. In this case, one RTA process can be omitted.

While the invention has been described in detail, the foregoing description is in all aspects illustrative and not restrictive. It is understood that numerous other modifications and variations can be devised without departing from the scope of the invention.

We claim:

1. A MIS transistor comprising:

a silicon substrate;

a gate insulation film formed on said silicon substrate;

a gate electrode formed on said gate insulation film;

source and drain regions formed in said silicon substrate;

a sidewall spacer formed on sides of said gate electrode on said silicon substrate, said sidewall spacer including a buffer nitrided oxide silicon layer in contact with said silicon substrate adjacent said source and drain regions, and a silicon nitride layer; and a silicide film outside of said sidewall spacer in said silicon substrate, said silicide film including a metal to be a diffusion species for silicon in silicide reaction wherein said buffer nitrided oxide silicon layer has its peak of nitrogen concentration on an interface with said silicon substrate; and the nitrogen concentration in said buffer nitrided oxide silicon layer declines with distance from said silicon substrate.

2. The MIS transistor of claim 1, wherein said metal to be diffusion species for silicon consists of cobalt.

3. The MIS transistor of claim 1, wherein said metal to be diffusion species for silicon consists of nickel.

4. The MIS transistor of claim 1, wherein said metal to be diffusion species for silicon consists of alloy including cobalt.

5. The MIS transistor of claim 1, wherein said metal to be diffusion species for silicon consists of alloy including nickel.

6. The MIS transistor of claim 1, wherein said silicon nitride layer is formed only on the sides of said gate electrode.

7. The MIS transistor of claim 1, wherein said buffer nitrided oxide silicon layer is formed only in a portion which is in contact with said silicon substrate adjacent said source and drain regions.

* * * * *